(12) United States Patent
Liu et al.

(10) Patent No.: US 10,169,635 B2
(45) Date of Patent: Jan. 1, 2019

(54) DISPLAY DEVICE AND METHOD FOR FABRICATING A DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yingming Liu, Beijing (CN); Xue Dong, Beijing (CN); Xiaochuan Chen, Beijing (CN); Haisheng Wang, Beijing (CN); Xiaoliang Ding, Beijing (CN); Shengji Yang, Beijing (CN); Weijie Zhao, Beijing (CN); Changfeng Li, Beijing (CN); Wei Liu, Beijing (CN); Pengpeng Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/556,752

(22) PCT Filed: Jan. 16, 2017

(86) PCT No.: PCT/CN2017/071260
§ 371 (c)(1),
(2) Date: Sep. 8, 2017

(87) PCT Pub. No.: WO2017/190531
PCT Pub. Date: Nov. 9, 2017

(65) Prior Publication Data
US 2018/0121698 A1 May 3, 2018

(30) Foreign Application Priority Data
May 5, 2016 (CN) .......................... 2016 1 0294146

(51) Int. Cl.
*G06K 9/00* (2006.01)
*H01L 41/047* (2006.01)
(Continued)

(52) U.S. Cl.
CPC .......... *G06K 9/0002* (2013.01); *B06B 1/0644* (2013.01); *G06K 9/00* (2013.01);
(Continued)

(58) Field of Classification Search
CPC ............ B06B 1/0292; B60R 21/01516; B60R 21/01536; B60N 2/002; B60N 2/2863;
(Continued)

(56) References Cited

U.S. PATENT DOCUMENTS 5,617,065 A * 4/1997 Dydyk ..................... H03H 3/04
310/321
7,427,797 B2 * 9/2008 Ohguro ................. B81B 3/0018
257/414
(Continued)

FOREIGN PATENT DOCUMENTS

CN    104677399 A    6/2015
CN    105046243 A    11/2015
(Continued)

OTHER PUBLICATIONS

Eccardt et al., Micromachined ultrasound transducers with improved coupling factors from a CMOS compatible process, Mar. 2000 [retrieved Mar. 18, 2018], Ultrasonics, vol. 38, Issues 1-8,pp. 774-780. Retrieved from the Internet: https://www.sciencedirect.com/science/article/pii/S0041624X99000852.*
(Continued)

*Primary Examiner* — Andrew Moyer
*Assistant Examiner* — Dennis Rosario
(74) *Attorney, Agent, or Firm* — Armstrong Teasdale LLP

(57) ABSTRACT

The present disclosure relates to a display device and a method for fabricating a display device. The display device
(Continued)

includes a display layer and a base layer under the display layer. The base layer includes a substrate having a first conductivity type, a well region in a portion of a side of the substrate facing towards the display layer, the well region having a second conductivity type, and an ultrasonic receiver formed in the well region. The ultrasonic receiver includes a first bottom electrode facing towards the substrate, the first bottom electrode including a first semiconductor region formed in the well region, and the first semiconductor region having the first conductivity type, a first top electrode facing towards the display layer, and a first piezoelectric layer formed between the first bottom electrode and the first top electrode.

20 Claims, 4 Drawing Sheets

(51) Int. Cl.
  B06B 1/06 (2006.01)
  H01L 27/32 (2006.01)
(52) U.S. Cl.
  CPC ...... H01L 27/3225 (2013.01); H01L 27/3234 (2013.01); H01L 41/047 (2013.01)
(58) Field of Classification Search
  CPC .. G01S 15/88; G06K 9/00362; G06K 9/0002; A61B 8/4483; H01L 2924/1461; H01L 2924/00; H01L 41/0973; H01L 41/318; H01L 41/0815; H01L 41/1878; H01L 41/0805; H01L 51/0036; H01L 27/20; H01L 41/047; G01N 29/2406; B81C 1/00246; B81B 2201/0271; G06F 3/016; G06F 3/0436; G06F 3/0414; Y10T 29/42; Y10T 29/49005; Y10T 29/49155
  See application file for complete search history.

(56) References Cited

U.S. PATENT DOCUMENTS

| | | | |
|---|---|---|---|
| 9,099,526 B2* | 8/2015 | Or-Bach | H01L 21/6835 |
| 2015/0165479 A1* | 6/2015 | Lasiter | B06B 1/0666 |
| | | | 310/322 |
| 2015/0260691 A1* | 9/2015 | Nakayama | G01N 29/2481 |
| | | | 73/661 |
| 2017/0059699 A1* | 3/2017 | Mathe | A61B 5/117 |
| 2017/0110504 A1* | 4/2017 | Panchawagh | H01L 27/20 |

FOREIGN PATENT DOCUMENTS

| | | |
|---|---|---|
| CN | 105893985 A | 8/2016 |
| WO | 2014197504 A1 | 12/2014 |
| WO | 2015099410 A1 | 7/2015 |

OTHER PUBLICATIONS

PCT (CN) International Search Report, Application No. PCT/CN2017/071260, dated Apr. 20, 2017, 5 pps.
PCT (CN) Written Opinion, Application No. PCT/CN2017/071260, dated Apr. 20, 2017, 11 pps.: with English translation.

* cited by examiner

DISPLAY DEVICE AND METHOD FOR FABRICATING A DISPLAY DEVICE

CROSS REFERENCE TO RELATED APPLICATIONS

This patent application is a National Stage Entry of PCT/CN2017/071260 filed on Jan. 16, 2017, which claims the benefit and priority of Chinese Patent Application No. 201610294146.0 filed on May 5, 2016, the disclosures of which are incorporated herein by reference in their entirety as part of the present application.

BACKGROUND

The present disclosure relates to a display device and a method for fabricating a display device.

An optical fingerprint sensor is a sensor that is earliest used for fingerprint recognition. However, finger and lens requirements are relatively high. Moreover, the optical fingerprint sensor is larger in volume due to the lenses and focusing. Ultrasonic fingerprint recognition is a novel technology. Based on a fact that skins, fingerprint surfaces and air reflect and obstruct different acoustic waves generated by ultrasonic waves, the fingerprint sensor in an ultrasonic scanning technology may be almost not affected by the fingers and image capture platforms, neither touch nor capacitive sensors or buttons are needed, and acquired images are better in quality.

BRIEF DESCRIPTION

Embodiments of the present disclosure provide a display device and a method for fabricating a display device, which can at least solve a problem that in the prior art it is difficult to integrate a fingerprint recognition function onto a semiconductor substrate and integrate ultrasonic technologies into semiconductor technology devices.

The present disclosure provides a display device.

A first aspect of the present disclosure provides a display device, which includes a display layer and a base layer under the display layer, wherein the base layer includes a substrate, having a first conductivity type, a well region in a portion of a side of the substrate facing towards the display layer, the well region having a second conductivity type opposite to the first conductivity type, and an ultrasonic receiver, formed in the well region. The ultrasonic receiver includes a first bottom electrode, facing towards the substrate, the first bottom electrode including a first semiconductor region formed in the well region, and the first semiconductor region having the first conductivity type, a first top electrode, facing towards the display layer, and a first piezoelectric layer, formed between the first bottom electrode and the first top electrode.

In an embodiment, the display device further includes an ultrasonic emitter at a side, of the base layer far away from the display layer. The substrate serves as a second top electrode of the ultrasonic emitter. The ultrasonic emitter includes a second piezoelectric layer arranged under the substrate, and a second bottom electrode arranged under the second piezoelectric layer.

In an embodiment, the base layer further includes an insulating layer arranged on the substrate. The first piezoelectric layer and the first top electrode are formed in the insulating layer.

In an embodiment, the base layer further includes a reading module positioned at a side of the well region, and the reading module is configured to read an ultrasonic receiving signal.

In an embodiment, the reading module includes a first transistor and a conductive bridge. A gate region of the first transistor is positioned in the insulating layer, and a source/drain region of the first transistor is positioned in the substrate. An end of the conductive bridge is connected to the first semiconductor region, another end of the conductive bridge is connected to the source/drain region of the first transistor, and the conductive bridge has a portion separated from the substrate between the end and the other end of the conductive bridge.

In an embodiment, the base layer further includes a reset module positioned at another side of the well region, and the reset module is configured to input a reset signal to the ultrasonic emitter.

In an embodiment, the reset module includes a second transistor. A gate region of the second transistor is positioned in the insulating layer, and a source/drain region of the second transistor is positioned in the substrate. The well region serves as a source region or a drain region of the second transistor.

In an embodiment, the base layer further includes a display signal input module, and the display signal input module is configured to input a display signal to the display layer.

In an embodiment, the display signal input module includes a third transistor. A gate region of the third transistor is positioned in the insulating layer, and a source/drain region of the third transistor is positioned in the substrate. The third transistor is electrically connected to the display layer through a via hole arranged in the insulating layer.

In an embodiment, a plurality of via holes is provided, and a metallic contact is further arranged between the plurality of via holes.

In an embodiment, the ultrasonic emitter further includes a buffer layer, and the buffer layer is arranged between the second piezoelectric layer and the second bottom electrode.

Another objective of the present disclosure is to provide a method for fabricating a display device.

A second aspect of the present disclosure provides a method for fabricating a display device, which includes forming a display layer and a base layer under the display layer, wherein forming the base layer includes forming a substrate having a first conductivity type, forming, at a top side of the substrate, a well region having a second conductivity type opposite to the first conductivity type, and forming an ultrasonic receiver in the well region. Forming the ultrasonic receiver includes forming a first semiconductor region having the first conductivity type in the well region, the first semiconductor region serving as a first bottom electrode of the ultrasonic receiver, forming a first piezoelectric layer on the first bottom electrode, and forming a first top electrode on the first piezoelectric layer.

In an embodiment, the method further includes forming an ultrasonic emitter at a bottom side of the base layer. The substrate serves as a second top electrode of the ultrasonic emitter. Forming the ultrasonic emitter includes arranging a second piezoelectric layer under the substrate, and arranging a second bottom electrode under the second piezoelectric layer.

In an embodiment, forming the base layer further includes arranging an insulating layer on the substrate. The first piezoelectric layer and the first top electrode are formed in the insulating layer.

In an embodiment, forming the base layer further includes forming a reading module positioned at a side of the well region. The reading module is configured to read an ultrasonic receiving signal.

In an embodiment, the reading module includes a first transistor and a conductive bridge. A gate region of the first transistor is positioned in the insulating layer, and a source/drain region of the first transistor is positioned in the substrate. An end of the conductive bridge is connected to the first semiconductor region, the other end of the conductive bridge is connected to the source/drain region of the first transistor, and the conductive bridge has a portion separated from the substrate between the end and the other end.

In an embodiment, forming the base layer further includes forming a reset module positioned at another side of the well region. The reset module is configured to input a reset signal to the ultrasonic emitter.

In an embodiment, the reset module includes a second transistor. A gate region of the second transistor is positioned in the insulating layer, and a source/drain region of the second transistor is positioned in the substrate. The well region serves as a source region or a drain region of the second transistor.

In an embodiment, forming the base layer further includes forming a display signal input module. The display signal input module is configured to input a display signal to the display layer.

In an embodiment, the display signal input module includes a third transistor. A gate region of the third transistor is positioned in the insulating layer, and a source/drain region of the third transistor is positioned in the substrate. The third transistor is electrically connected to the display layer through a via hole arranged in the insulating layer.

In an embodiment, a plurality of via holes is provided, and a metallic contact is further arranged between the plurality of via holes.

In an embodiment, forming the ultrasonic emitter further includes forming a buffer layer between the second piezoelectric layer and the second bottom electrode.

The embodiments of the present disclosure provide a display device and a method for fabricating a display device, wherein the display device includes a display layer and a base layer under the display layer. The base layer includes a substrate, having a first conductivity type, a well region of a side of the substrate facing towards the display layer, the well region having a second conductivity type, and an ultrasonic receiver, formed in the well region. The ultrasonic receiver includes a first bottom electrode, facing towards the substrate, the first bottom electrode including a first semiconductor region formed in the well region, and the first semiconductor region having the first conductivity type a first top electrode, facing towards the display layer, and a first piezoelectric layer, formed between the first bottom electrode and the first top electrode. The display device can at least integrate the fingerprint recognition function onto a semiconductor (for example, Si-based) substrate and integrate the ultrasonic technologies into semiconductor (for example, CMOS) technology devices.

BRIEF DESCRIPTION OF THE DRAWINGS

To describe technical solutions of the embodiments of the present disclosure more clearly, the following will briefly introduce the accompanying drawings of the embodiments. It should be known that the accompanying drawings in the following description merely involve with some embodiments of the present disclosure, but not limit the present disclosure, in which.

DETAILED DESCRIPTION

To make technical solutions and advantages of the embodiments of the present disclosure clearer, the following will clearly and completely describe the technical solutions of the embodiments of the present disclosure with reference to the accompanying drawings. Apparently, the described embodiments are some but not all of the embodiments of the present disclosure. All other embodiments obtained by a person skilled in the art based on the described embodiments of the present disclosure without creative efforts shall fall within the protection scope of the present disclosure.

When an element and an embodiment of the present disclosure are introduced, the articles "a", "an", "the" and "said" are intended to indicate that one or more elements are present. The terms "comprising", "including", "containing" and "having" are intended to be inclusive and mean that there may be additional elements other than the listed elements.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covered with", "on top of", "positioned on", or "positioned on top of" mean that, for example, a first element of a first structure is on a second element of a second structure, wherein an intermediate element such as an interface structure may exist between the first element and the second element. The term "contact" means that, for example, the first element of the first structure and the second element of the second structure are connected, and other elements may exist or not exist on the interfaces of the two elements.

Figure 1:
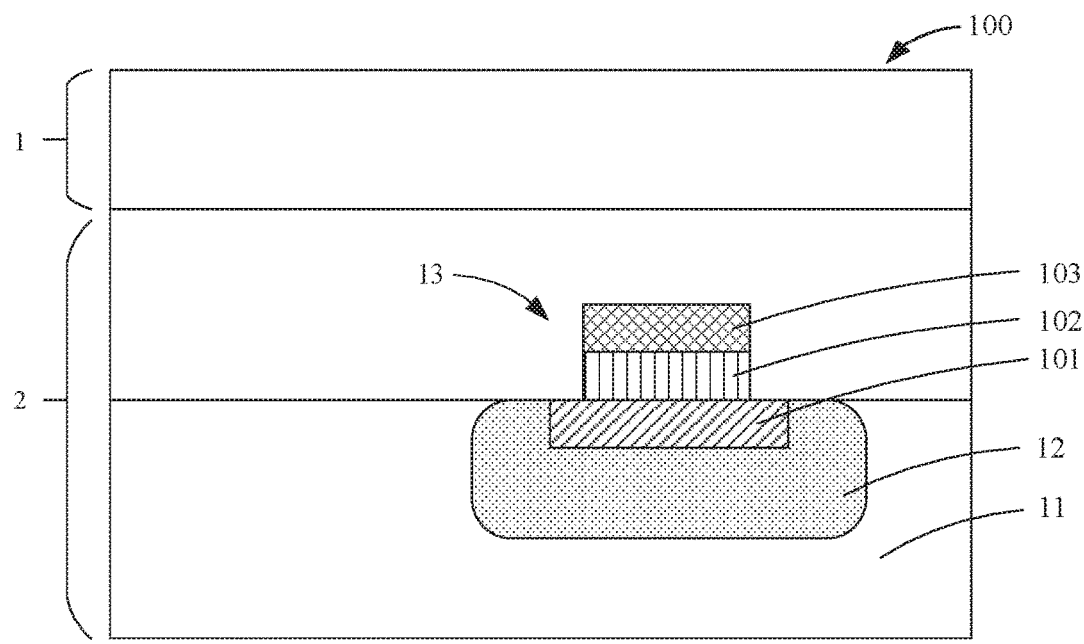
FIG. 1 is a schematic cross section of a display device according to an embodiment of the present disclosure.

FIG. 1 is a schematic cross section of a display device according to an embodiment of the present disclosure. As shown in FIG. 1, the display device 100 according to the embodiment of the present disclosure includes a display layer 1 and a base layer 2 under the display layer 1. The base layer includes a substrate 11, a well region 12 positioned in a portion of a side of the substrate facing towards the display layer, and an ultrasonic receiver 13 formed in the well region. The substrate 11 has a first conductivity type. For example, the substrate 11 may be a P-type semiconductor material. The well region 12 has a second conductivity type opposite to the first conductivity type. For example, the well region 12 may be a heavily doped N-type semiconductor material (N+). The ultrasonic receiver 13 includes a first bottom electrode facing towards the substrate 11, a first top electrode 103 facing towards the display layer 1, and a first piezoelectric layer 102 formed between the first bottom electrode and the first top electrode 103. The first bottom electrode includes a first semiconductor region 101 formed in the well region, and the first semiconductor region 101 has the first conductivity type. For example, the first semiconductor region 101 may be a heavily doped P-type semiconductor material (P+).

Figure 2:
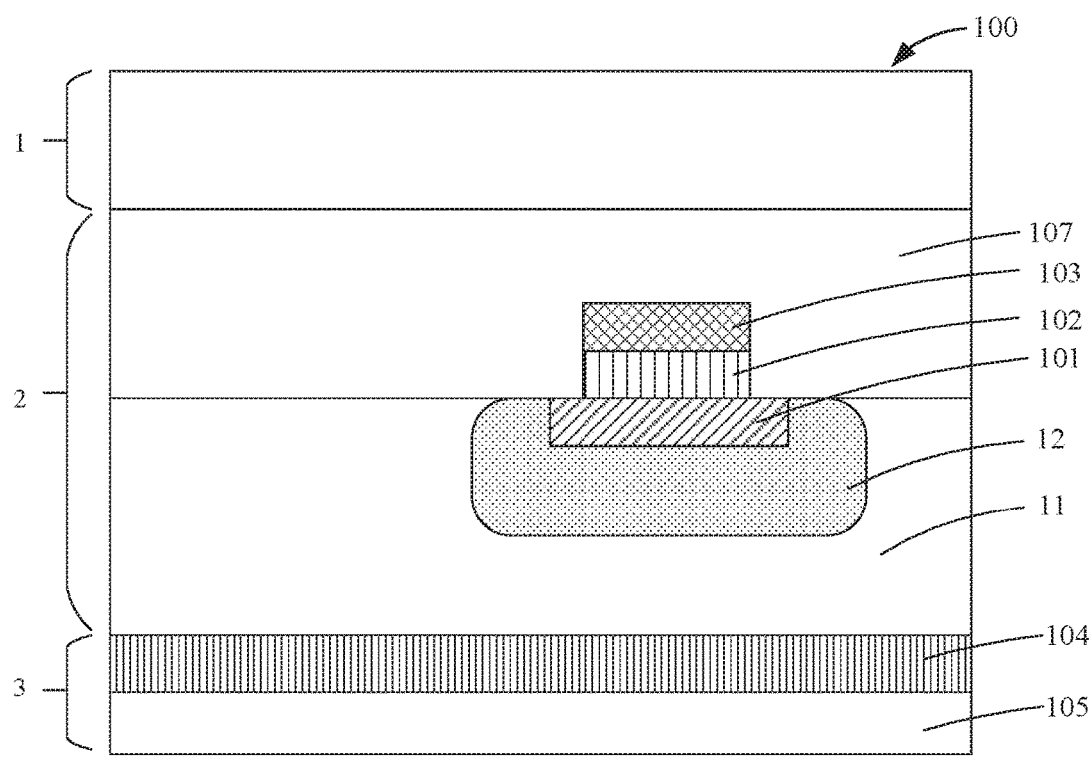
FIG. 2 is a schematic cross section of a display device according to an embodiment of the present disclosure.

As shown in FIG. 2, the display device 100 according to the embodiment of the present disclosure may further include an ultrasonic emitter 3 on a side of the base layer 2 far away from the display layer. The substrate 11 serves as a second top electrode of the ultrasonic emitter. The ultrasonic emitter includes a second piezoelectric layer 104 and a second bottom electrode 105. The second piezoelectric layer 104 is arranged under the substrate 11, and the second bottom electrode 105 is arranged under the second piezoelectric layer 104.

The base layer 2 may further include an insulating layer 107 arranged on the substrate. The first piezoelectric layer 102 and the first top electrode 103 are formed in the insulating layer 107.

The base layer 2 may further include a reading module M1 positioned at a side of the well region 12. The reading module M1 is configured to read an ultrasonic receiving signal.

Figure 3:
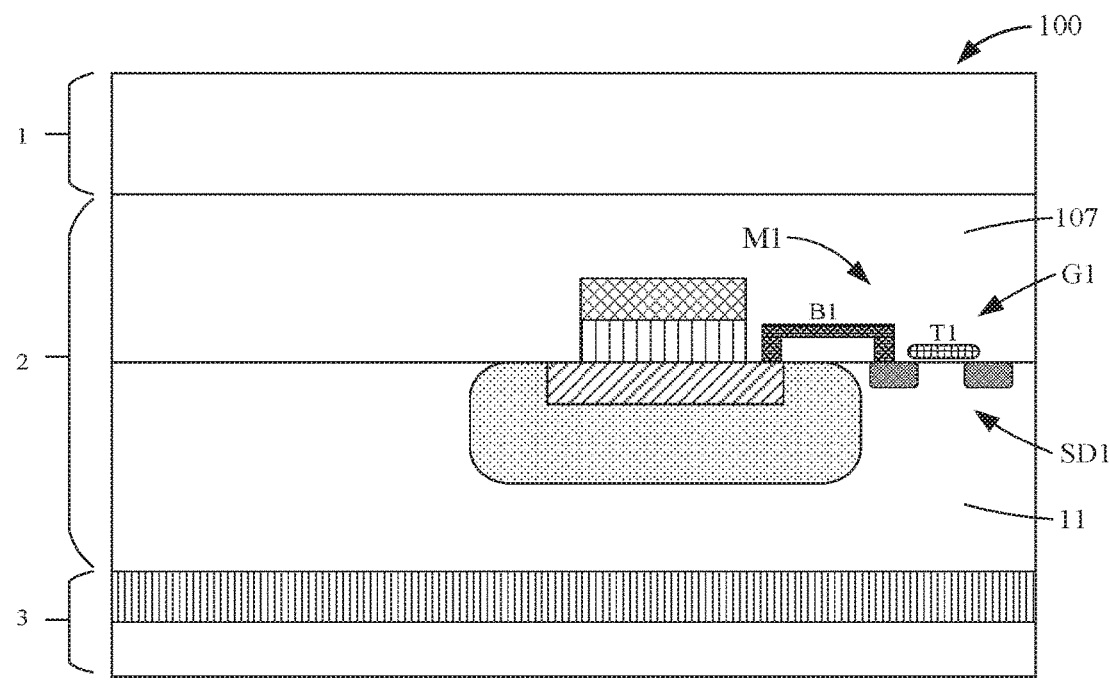
FIG. 3 is a schematic cross section of a display device according to an embodiment of the present disclosure.

As shown in FIG. 3, in an embodiment, specifically, the reading module M1 may include a first transistor T1 and a conductive bridge B1. A gate region G1 of the first transistor T1 is positioned in the insulating layer 107, and a source/drain region SD1 of the first transistor T1 is positioned in the substrate 11. An end of the conductive bridge B1 is connected to the first semiconductor region 101, another end of the conductive bridge B1 is connected to the source/drain region SD1 of the first transistor T1, and the conductive bridge B1 has a portion separated from the substrate 11 between the end and the other end. Also an objective of preventing short circuit is considered for such a configuration of the conductive bridge.

The base layer 2 may further include a reset module M2 positioned at another side of the well region 12. The reset module M2 is configured to input a reset signal to the ultrasonic emitter.

Figure 4:
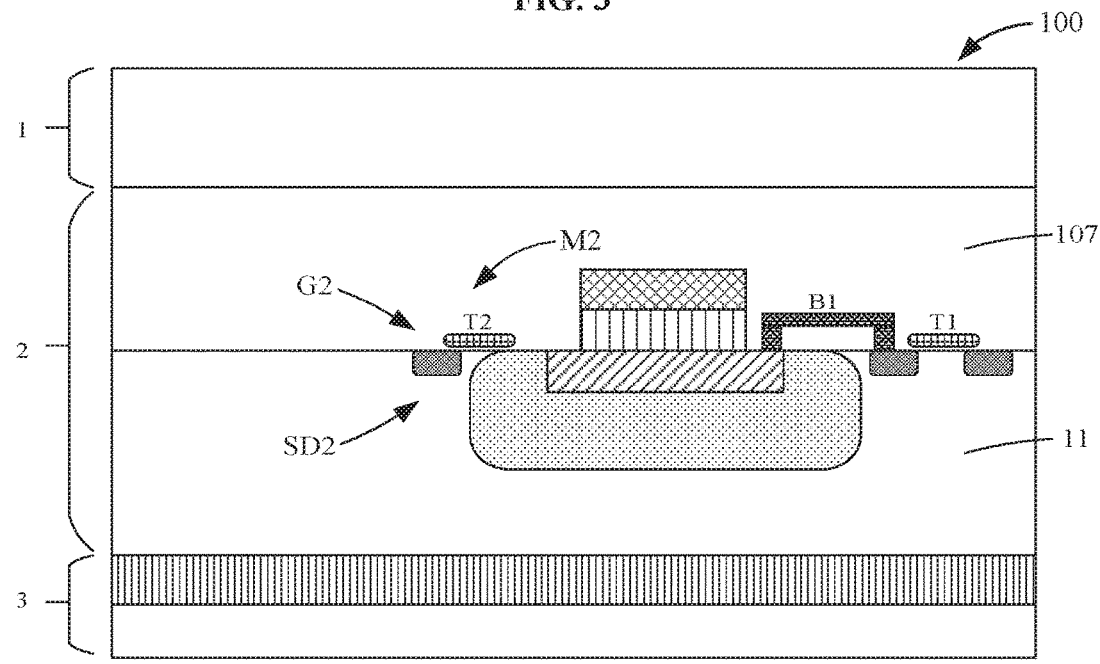
FIG. 4 is a schematic cross section of a display device according to an embodiment of the present disclosure.

As shown in FIG. 4, in an embodiment, specifically, the reset module M2 may include a second transistor T2. A gate region G2 of the second transistor T2 is positioned in the insulating layer 107, and a source/drain region SD2 of the second transistor T2 is positioned in the substrate 11. The well region 12 serves as a source region or a drain region of the second transistor T2.

The base layer 2 may further include a display signal input module M3. The display signal input module M3 is configured to input a display signal to the display layer 1.

Figure 5:
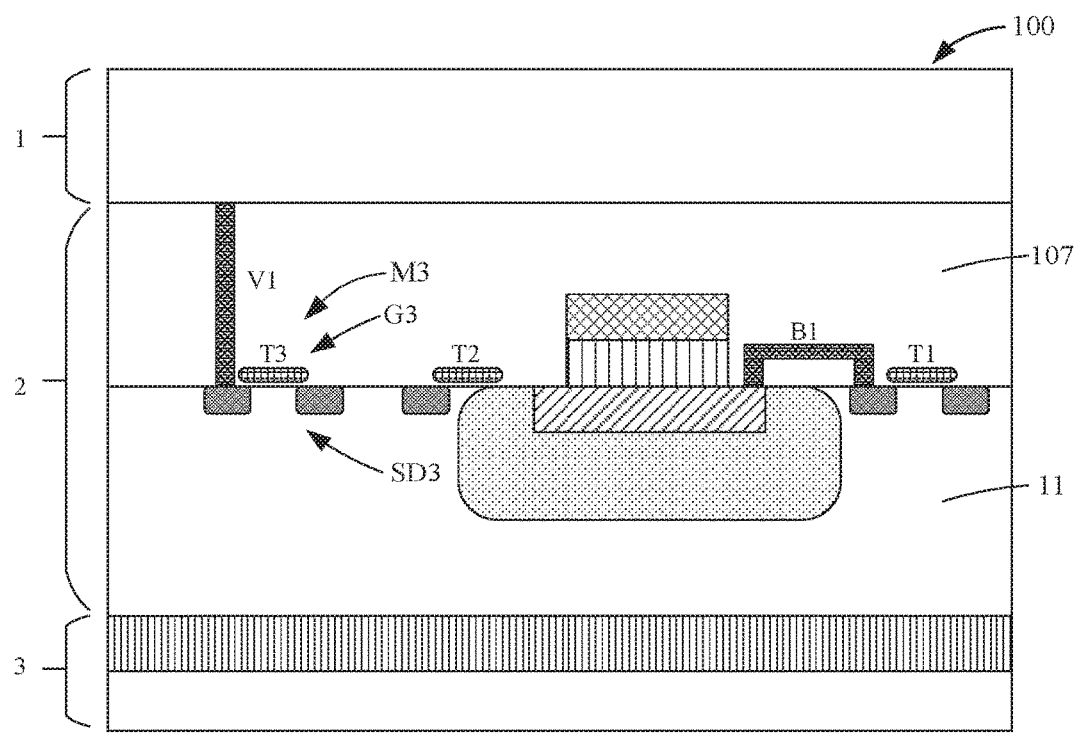
FIG. 5 is a schematic cross section of a display device according to an embodiment of the present disclosure.

As shown in FIG. 5, in an embodiment, specifically, the display signal input module M3 includes a third transistor T3. A gate region G3 of the third transistor T3 is positioned in the insulating layer 107, and a source/drain region SD3 of the third transistor T3 is positioned in the substrate 11. The third transistor T3 is electrically connected to the display layer 1 through a via hole V1 arranged in the insulating layer 107. A plurality of the via holes may be provided to avoid a single via hole being too deep. When a plurality of via holes is provided, a metallic contact is further arranged between the plurality of via holes.

Figure 6:
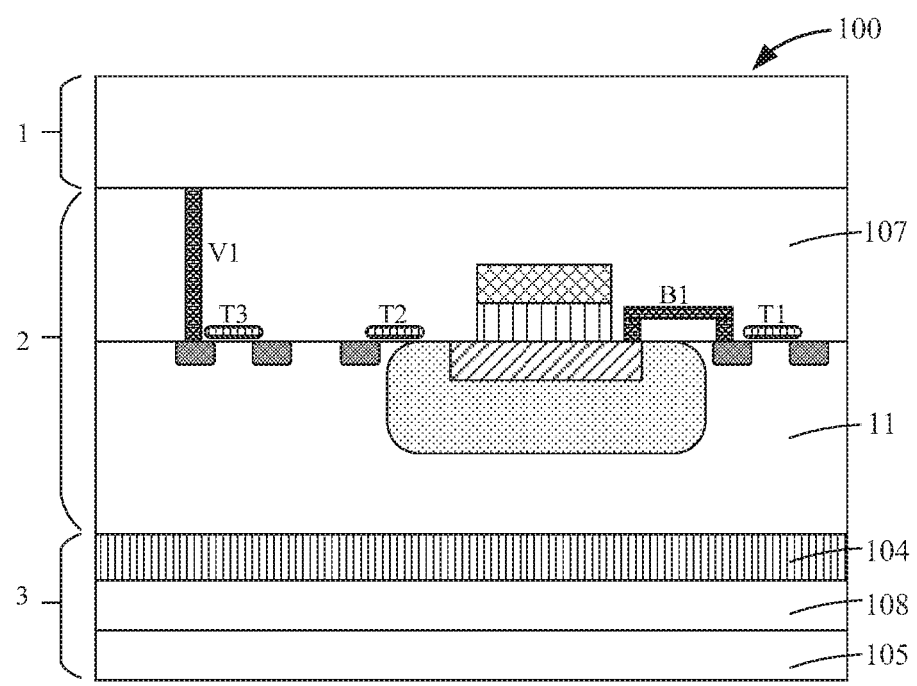
FIG. 6 is a schematic cross section of a display device according to an embodiment of the present disclosure.

As shown in FIG. 6, ultrasonic emitter may further include a buffer layer 108, wherein the buffer layer is arranged between the second piezoelectric layer 104 and the second bottom electrode 105. The buffer layer may include any suitable material as long as the ultrasonic intensity can be enhanced.

In an embodiment, the substrate 11 may include silicon. The first conductivity type is P type, and the second conductivity type is N type. The first piezoelectric layer includes a piezoelectric material such as ZnS, and the second piezoelectric layer includes a piezoelectric material such as ZnS. The first top electrode includes ITO (a transparent conductive oxide), and the second bottom electrode includes a metal.

The display layer 1 may include any suitable display structure such as an LED. When the display structure is an OLED, the display layer may include a cathode, an organic light emitting layer, and an anode. In this situation, a display pixel design of the display structure is similar to a conventional OLED structure, and thus a detailed description is omitted herein. The display device according to the embodiment of the present disclosure may further include a cover arranged on the display layer, which is also not repeated any more herein.

In an embodiment, a P-type Si-based material is used as the substrate material. A backside of a P-type silicon is provided with a piezoelectric material (such as ZnS material) to form the second piezoelectric layer. It is to be pointed out that the piezoelectric material is not limited to zinc sulfide, and may also include any other suitable material as long as a vibration wave may be generated in the event that a voltage (such as a square wave voltage) is applied. Next, metal is fabricated, in whole, on the piezoelectric material to provide a driving wave (such as a square wave).

In an embodiment, a surface of a PN junction corresponding to the ultrasonic receiver is doped into P+ (that is, the first semiconductor region) to form a buried PN junction, which is advantageous to reducing leakage current of a PN diode. Next, on the P+ layer (namely, the first semiconductor region) there is provided with a piezoelectric material such as ZnS to form the first piezoelectric layer. As mentioned above, a side of the first transistor serving as the reading module connects the well region, and another side of the first transistor may accesses to a readline signal. When in operation, a fixed high potential signal may be applied to the first top electrode (for example, an ITO layer), and the P-type substrate is grounded. After the first transistor is turned on, a voltage difference is generated between the first top electrode and an accessed "readline signal" terminal of the first transistor. For the fingerprint recognition, if a finger touches the display device, the first piezoelectric material may transform an ultrasonic wave reflected by the finger to current, which may be read by the first transistor.

For the fingerprint recognition, the currents generated at the ultrasonic receiver are different because ultrasonic energies corresponding to a valley and a ridge of the finger are different. It should be pointed out that the fingerprint recognition herein is merely exemplary, and the display device in the embodiments of the present disclosure also may be intended to recognize other objects other than the finger as long as the objects can use ultrasonic technologies for recognition.

In the embodiments of the present disclosure, the ultrasonic signal is unrelated to the display signal. Therefore, the fingerprint recognition and the display function may be performed simultaneously. Furthermore, according to the embodiments of the present disclosure, the ultrasonic receiver having a PN junction arranged under the display layer is adopted, so that a light-emitting material may be arranged above the ultrasonic receiver, and thus the display effect of the display layer is not reduced.

Specifically, according to an embodiment of the present disclosure, when the P-type substrate and CMOS technologies are used, an implementation process of the display function and the recognition function of the display device according to the embodiment of the present disclosure is as below.

1. The Display Function

Semiconductor technologies such as CMOS technologies are used, and display of the display layer such as an OLED is displayed by way of the display signal input module.

2. The Recognition Function (1) The P-type substrate is grounded, and a drive signal (such as a square-wave signal) is applied to the second bottom electrode.

(2) A part of the ultrasonic wave is directly emitted from the display device, and a part of the ultrasonic wave reaches a receiving end (the first top electrode) of the ultrasonic receiver. For the fingerprint recognition, there is more air nearby a fingerprint valley. Therefore, the energy of the ultrasonic wave reflected by the fingerprint valley may be less than that of the ultrasonic wave reflected by a fingerprint ridge, correspondingly, the current generated by the fingerprint valley at the ultrasonic receiver is less than that generated by the fingerprint ridge at the ultrasonic receiver, and thus recognition of the fingerprint valley and the fingerprint ridge can be implemented.

The present disclosure further provides a method for fabricating the display device. Reference may be made to FIG. 1-FIG. 5 for details.

In one embodiment, the method includes forming a display layer 1 and a base layer 2 under the display layer 1. Forming the base layer 2 includes forming a substrate 11 having a first conductivity type, forming a well region 12 in a portion of a side of the substrate 11 facing towards the display layer, the well region having a second conductivity type opposite to the first conductivity type, and forming an ultrasonic receiver 13 in the well region.

Forming the ultrasonic receiver 13 includes forming a first semiconductor region 101 having the first conductivity type in the well region 12, wherein the first semiconductor region 101 serves as a first bottom electrode of the ultrasonic receiver 13, forming a first piezoelectric layer 102 on the first bottom electrode, and forming a first top electrode 103 on the first piezoelectric layer 102.

The method may further include forming an ultrasonic emitter 3 at a side of the base layer 2 far away from the display layer 1. The substrate serves as a second top electrode of the ultrasonic emitter 3. Forming the ultrasonic emitter 3 includes arranging a second piezoelectric layer 104 under the substrate 11, and arranging a second bottom electrode 105 under the second piezoelectric layer 104.

Forming the base layer 2 may further include arranging an insulating layer 107 on the substrate. The first piezoelectric layer 102 and the first top electrode 103 are formed in the insulating layer 107.

Forming the base layer 2 may further include forming a reading module M1 at a side of the well region 12. The reading module is configured to read an ultrasonic receiving signal.

In one embodiment, the reading module M1 may include a first transistor T1 and a conductive bridge B1. A gate region G1 of the first transistor T1 is positioned in the insulating layer 107, and a source/drain region SD1 of the first transistor T1 is positioned in the substrate 11. An end of the conductive bridge B1 is connected to the first semiconductor region, another end of the conductive bridge B1 is connected to the source/drain region SD1 of the first transistor T1, and the conductive bridge B1 has a portion separated from the substrate 11 between the end and the other end of the conductive bridge B1.

Forming the base layer 2 may further include forming a reset module M2 at another side of the well region 12. The reset module M2 is configured to input a reset signal to the ultrasonic emitter.

In one embodiment, the reset module M2 includes a second transistor T2. A gate region G2 of the second transistor T2 is positioned in the insulating layer 107, and a source/drain region SD2 of the second transistor T2 is positioned in the substrate 11. The well region 12 serves as a source region or a drain region of the second transistor T2.

Forming the base layer 2 may further include forming a display signal input module M3. The display signal input module M3 is configured to input a display signal to the display layer 1.

In one embodiment, the display signal input module M3 includes a third transistor T3. A gate region G3 of the third transistor T3 is positioned in the insulating layer 107, and a source/drain region SD3 of the third transistor T3 is positioned in the substrate. The third transistor T3 is electrically connected to the display layer 1 through a via hole V1 arranged in the insulating layer 107. A plurality of the via holes may be provided to avoid a single via hole being too deep. When a plurality of via holes is provided, a metallic contact is further arranged between the plurality of via holes.

Forming the ultrasonic emitter may further include forming a buffer layer 108 (see FIG. 6) between the second piezoelectric layer 104 and the second bottom electrode 105. The buffer layer may include any suitable material as long as the ultrasonic intensity can be enhanced.

In one embodiment of the present disclosure, a PN junction is formed, and one end of the PN junction is used as a signal end for receiving an ultrasonic signal. When the PN junction is reverse-biased, electrons may be stored and an effect of capacity may be generated. Therefore, the reflected ultrasonic wave is transformed to an electrical signal, which may be stored. Reading may be implemented when a certain value is reached, which is advantageous to accumulation of signals and detection of a difference value. Signals reflected by the ultrasonic wave are stored, so that the signals (for example, valley and ridge signals of fingers) may be better differentiated.

Certain specific embodiments have been described, and these embodiments are exhibited merely by examples and are not intended to limit the scope of the present disclosure. Indeed, the novel embodiments set forth herein may be implemented in a variety of other forms; in addition, various omissions, substitutions and changes can be made in the form of the embodiments set forth herein without departing from the spirit of the present disclosure. The appended claims and equivalents thereof are intended to cover this form or modification thereof that fall within the scope and spirit of the present disclosure.

What is claimed is:

1. A display device comprising a display layer and a base layer under the display layer, wherein the base layer comprises:
a substrate having a first conductivity type;
a well region, positioned in a portion of a side of the substrate facing towards the display layer, the well region having a second conductivity type opposite to the first conductivity type; and
an ultrasonic receiver formed in the well region, wherein the ultrasonic receiver comprises:
a first bottom electrode facing towards the substrate, the first bottom electrode comprising a first semiconductor region formed in the well region, and the first semiconductor region having the first conductivity type;
a first top electrode facing towards the display layer; and
a first piezoelectric layer, formed between the first bottom electrode and the first top electrode.

2. The display device according to claim 1, further comprising an ultrasonic emitter on a side of the base layer opposite from a side facing the display layer, wherein the substrate serves as a second top electrode of the ultrasonic emitter, and wherein the ultrasonic emitter comprises:
a second piezoelectric layer arranged under the substrate; and
a second bottom electrode arranged under the second piezoelectric layer.

3. The display device according to claim 2, wherein the base layer further comprises an insulating layer arranged on the substrate, and wherein the first piezoelectric layer and the first top electrode are in the insulating layer.

4. The display device according to claim 3, wherein the base layer further comprises a reading module positioned at a side of the well region, and wherein the reading module is configured to read an ultrasonic receiving signal.

5. The display device according to claim 4, wherein the reading module comprises a first transistor and a conductive bridge, wherein:
a gate region of the first transistor is positioned in the insulating layer, and a source/drain region of the first transistor is positioned in the substrate; and
an end of the conductive bridge is connected to the first semiconductor region, the other end of the conductive bridge is connected to the source/drain region of the first transistor, and the conductive bridge has a portion separated from the substrate between the end and the other end.

6. The display device according to claim 4, wherein the base layer further comprises a reset module positioned at another side of the well region, and wherein the reset module is configured to input a reset signal to the ultrasonic emitter.

7. The display device according to claim 6, wherein the reset module comprises a second transistor, wherein:
a gate region of the second transistor is positioned in the insulating layer, and a source/drain region of the second transistor is positioned in the substrate; and
the well region is configured to serve as one of a source region and a drain region of the second transistor.

8. The display device according to claim 6, wherein the base layer further comprises a display signal input module, and wherein the display signal input module is configured to input a display signal to the display layer.

9. The display device according to claim 8, wherein the display signal input module comprises a third transistor, wherein:
a gate region of the third transistor is positioned in the insulating layer, and a source/drain region of the third transistor is positioned in the substrate; and
the third transistor is electrically connected to the display layer through a via hole arranged in the insulating layer.

10. The display device according to claim 9, wherein a plurality of via holes is provided, and wherein a metallic contact is further arranged between the plurality of via holes.

11. A method for fabricating a display device, comprising forming a display layer and a base layer under the display layer, wherein forming the base layer comprises:
forming a substrate having a first conductivity type;
forming a well region in a portion of a side of the substrate facing towards the display layer, the well region having a second conductivity type opposite to the first conductivity type; and
forming an ultrasonic receiver in the well region, wherein forming the ultrasonic receiver comprises:
forming a first semiconductor region having the first conductivity type in the well region, the first semiconductor region serving as a first bottom electrode of the ultrasonic receiver;
forming a first piezoelectric layer on the first bottom electrode; and
forming a first top electrode on the first piezoelectric layer.

12. The method according to claim 11, further comprising forming an ultrasonic emitter at a side of the base layer opposite from a side facing the display layer, wherein the substrate serves as a second top electrode of the ultrasonic emitter, and wherein forming the ultrasonic emitter comprises:
arranging a second piezoelectric layer under the substrate; and
arranging a second bottom electrode under the second piezoelectric layer.

13. The method according to claim 12, wherein forming the base layer further comprises arranging an insulating layer on the substrate, and wherein the first piezoelectric layer and the first top electrode are in the insulating layer.

14. The method according to claim 13, wherein forming the base layer further comprises forming a reading module at a side of the well region, the reading module being configured to read an ultrasonic receiving signal.

15. The method according to claim 14, wherein the reading module comprises a first transistor and a conductive bridge, wherein:
a gate region of the first transistor is positioned in the insulating layer, and a source/drain region of the first transistor is positioned in the substrate; and
an end of the conductive bridge is connected to the first semiconductor region, the other end of the conductive bridge is connected to the source/drain region of the first transistor, and the conductive bridge has a portion separated from the substrate between the end and the other end.

16. The method according to claim 14, wherein forming the base layer further comprises forming a reset module at another side of the well region, the reset module configured to input a reset signal to the ultrasonic emitter.

17. The method according to claim 16, wherein the reset module comprises a second transistor, wherein:
a gate region of the second transistor is positioned in the insulating layer, and a source/drain region of the second transistor is positioned in the substrate; and
the well region serves as a source region or a drain region of the second transistor.

18. The method according to claim 16, wherein forming the base layer further comprises forming a display signal input module, the display signal input module being configured to input a display signal to the display layer.

19. The method according to claim 18, wherein the display signal input module comprises a third transistor, wherein:
a gate region of the third transistor is positioned in the insulating layer, and a source/drain region of the third transistor is positioned in the substrate; and
the third transistor is electrically connected to the display layer through a via hole arranged in the insulating layer.

20. The method according to claim 19, wherein a plurality of via holes are provided, and wherein a metallic contact is further arranged between the plurality of via holes.

\* \* \* \* \*